United States Patent
Best et al.

(10) Patent No.: US 7,410,880 B2
(45) Date of Patent: Aug. 12, 2008

(54) METHOD FOR MEASURING BONDING QUALITY OF BONDED SUBSTRATES, METROLOGY APPARATUS, AND METHOD OF PRODUCING A DEVICE FROM A BONDED SUBSTRATE

(75) Inventors: Keith Frank Best, Prunedale, CA (US); Joseph J. Consolini, Costa Mesa, CA (US); Alexander Friz, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 403 days.

(21) Appl. No.: 11/020,554

(22) Filed: Dec. 27, 2004

(65) Prior Publication Data

US 2006/0141738 A1    Jun. 29, 2006

(51) Int. Cl.
*H01L 21/76* (2006.01)
(52) U.S. Cl. .................. 438/401; 438/457; 356/399
(58) Field of Classification Search .................. 438/14, 438/406, 455, 401, 457; 356/399–402
See application file for complete search history.

(56) References Cited

U.S. PATENT DOCUMENTS

| | | | |
|---|---|---|---|
| 4,774,196 A | | 9/1988 | Blanchard |
| 4,883,215 A | | 11/1989 | Goesele et al. |
| 5,118,953 A | * | 6/1992 | Ota et al. .................. 250/548 |
| 5,361,132 A | * | 11/1994 | Farn .......................... 356/509 |
| 6,768,539 B2 | * | 7/2004 | Gui et al. .................. 355/53 |
| 6,844,244 B2 | * | 1/2005 | Best et al. .................. 438/460 |

FOREIGN PATENT DOCUMENTS

| | | |
|---|---|---|
| DE | 195 25 769 C1 | 8/1996 |
| DE | 195 25 770 C1 | 8/1996 |
| TW | 526578 | 3/2002 |

OTHER PUBLICATIONS

Martin A. Schmidt, "Wafer-to-Wafer Bonding for Microstructure Formation", Proceedingsof the IEEE, vol. 86, No. 8, pp. 1575-1585 (Aug. 1998) XP-000848427.
A. C. Gracias et al., "Photoacoustic imaging of voids in direct wafer bonding", Review of Scientific Instruments, American Instutute of Physics, vol. 71, No. 4 pp. 1869-1872 (Apr. 2000) XP012038250.

(Continued)

*Primary Examiner*—W. David Coleman
*Assistant Examiner*—Khiem D Nguyen
(74) *Attorney, Agent, or Firm*—Pillsbury Winthrop Shaw Pittman LLP

(57) ABSTRACT

In a method for measuring the bonding quality of bonded substrates, such as bonded SOI wafers, a plurality of marks are created at a first side of a top substrate after, or before, the bonding of the top substrate onto a bottom substrate. Then, the positions of the plurality of marks are measured using a metrology tool. Next, for each of the marks, a difference between a measured position and an expected position is calculated. These differences can be used to determine delamination between the top substrate and the bottom substrate. By displaying a vector field representing the differences, and by not showing vectors that exceed a certain threshold, the delamination areas can be made visible.

14 Claims, 6 Drawing Sheets

OTHER PUBLICATIONS

Akira USAMI et al., "Contactless Evaluation Using a Laser/Microwave Method for the Silicon-on-Insulator Made by Wafer Bonding", IEICE Transactions on Electronics, Electronics Society, vol. E75-C, No. 9 pp. 1043-1048 (Sep. 1992) XP000322429.

European Search Report issued in EP 05 11 2290 dated Mar. 24, 2006.

ROC (Taiwan) Search Report issued in TW No. 094146565 dated Mar. 20, 2007.

* cited by examiner

METHOD FOR MEASURING BONDING QUALITY OF BONDED SUBSTRATES, METROLOGY APPARATUS, AND METHOD OF PRODUCING A DEVICE FROM A BONDED SUBSTRATE

BACKGROUND OF THE INVENTION

1. Field of the Invention

The present invention relates to a method for measuring bonding quality of bonded substrates, a metrology apparatus, and a device manufacturing method.

2. Description of the Related Art

In a lithographic manufacturing process, a lithographic apparatus applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In the manufacture of Micro Electronic Mechanical Systems (MEMS), a substrate including mechanical devices, here referred to as top substrate, is bonded on top of a substrate including electronic devices, referred to as bottom substrate. Both the bottom as well as the top substrate may be Silicon On Insulator (SOI) substrates. Currently, SOI substrate bonding technology is used at the manufacture of those substrates. Either qualitative infrared (IR) systems or surface flatness systems are used to assess the substrate bonding quality in order to test for de-lamination. Both of these methods are expensive, and in most cases they are qualitative rather than quantitative.

SUMMARY OF THE INVENTION

It is an aspect of the present invention to provide a method of measuring the bonding quality of bonded substrates which is less expensive than the known methods.

According to an embodiment of the present invention, a method of measuring bonding quality of a bonded substrate having a top substrate on top of a bottom substrate includes creating a plurality of marks at a first side of the top substrate; bonding the top substrate onto the bottom substrate to form the bonded substrate; measuring positions of the plurality of marks; calculating, for each of the plurality of marks, a difference between a measured position and an expected position; determining delamination areas at an interface between the top substrate and the bottom substrate using the calculated differences.

According to another embodiment of the present invention, a method of producing an integrated device from a bonded substrate having a top substrate on top of a bottom substrate includes creating a plurality of marks at a first side of the top substrate; bonding the top substrate onto the bottom substrate to form the bonded substrate; measuring positions of the plurality of marks; calculating, for each of the plurality of marks, a difference between a measured position and an expected position; determining delamination areas at an interface between the top substrate and the bottom substrate using the calculated differences; determining whether the bonded substrate meets a predetermined quality criteria, and if not, rejecting the bonded substrate, and if so, projecting a patterned beam of radiation onto a target portion of the bonded substrate.

According to another embodiment of the present invention, a metrology apparatus includes a measuring unit configured to measure a position of a plurality of marks on a bonded substrate, the bonded substrate including a top substrate on top of a bottom substrate, and a processing unit configured to calculate, for each of the plurality of marks, a difference between a measured position and an expected position, the processing unit also being configured to determine delamination areas at an interface between the top substrate and the bottom substrate using the calculated differences.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
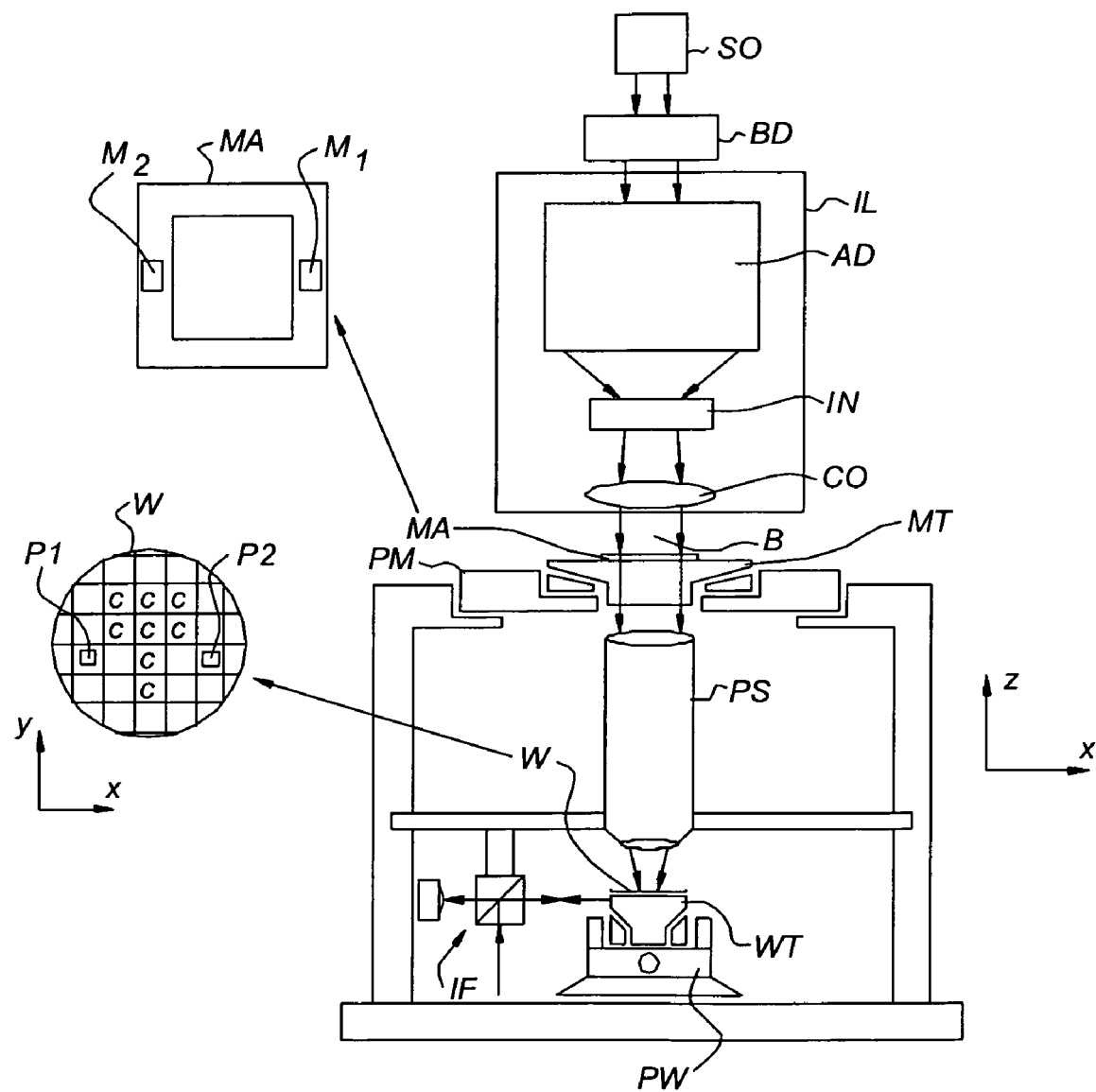
FIG. 1 depicts a lithographic apparatus according to an embodiment of the present invention that can be used to expose substrates, e.g., bonded substrates.

FIG. 1 schematically depicts a lithographic apparatus as can be used to expose substrates, e.g., bonded substrates. The apparatus includes an illumination system (illuminator) IL configured to condition a radiation beam B (e.g. UV radiation). A support (e.g. a mask table) MT is configured to support a patterning device (e.g. a mask) MA and is connected to a first positioning device PM configured to accurately position the patterning device in accordance with certain parameters. A substrate table (e.g. a wafer table) WT is configured to hold a substrate (e.g. a resist-coated wafer) W and is connected to a second positioning device PW configured to accurately position the substrate in accordance with certain parameters. A projection system (e.g. a refractive projection lens system) PS is configured to project the radiation beam B patterned by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjusting device AD configured to adjust the angular intensity distribution of the radiation beam. Generally, at least the outer and/or inner radial extent (commonly referred to as $\sigma$-outer and $\sigma$-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which projects the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1 but may be an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
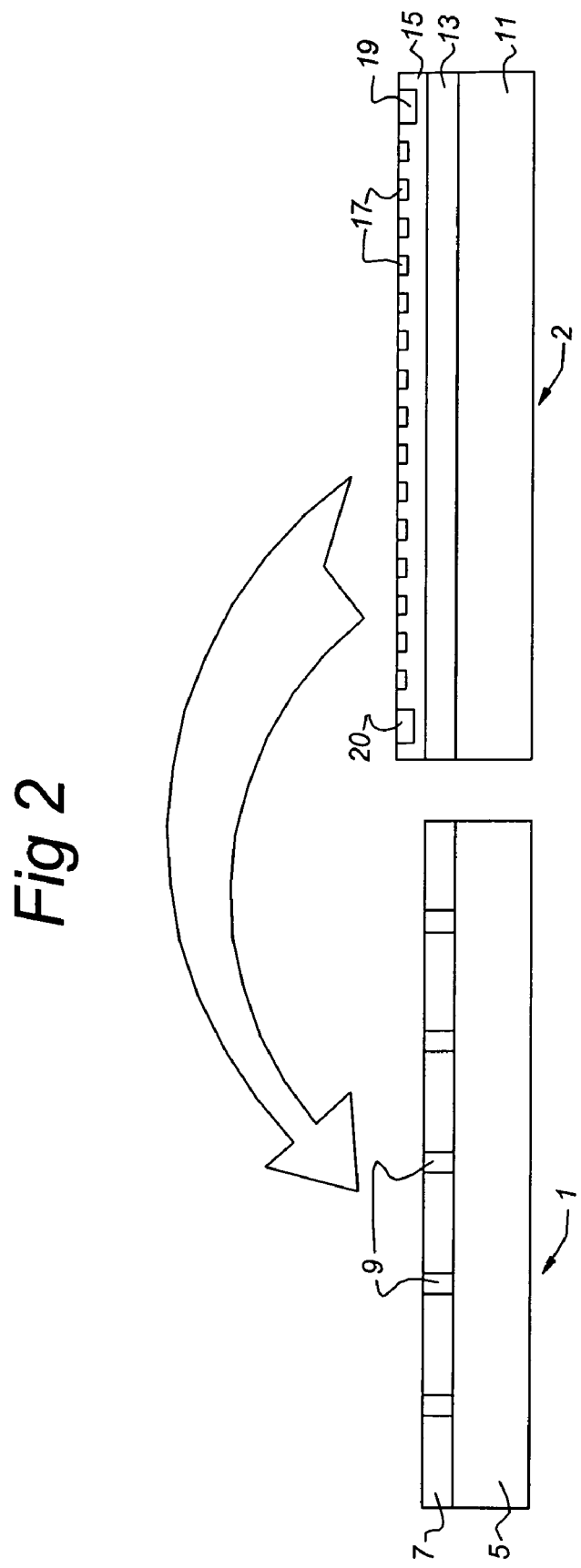
FIG. 2 depicts an example of cross sections of a bottom and a top substrate.
Figure 3:
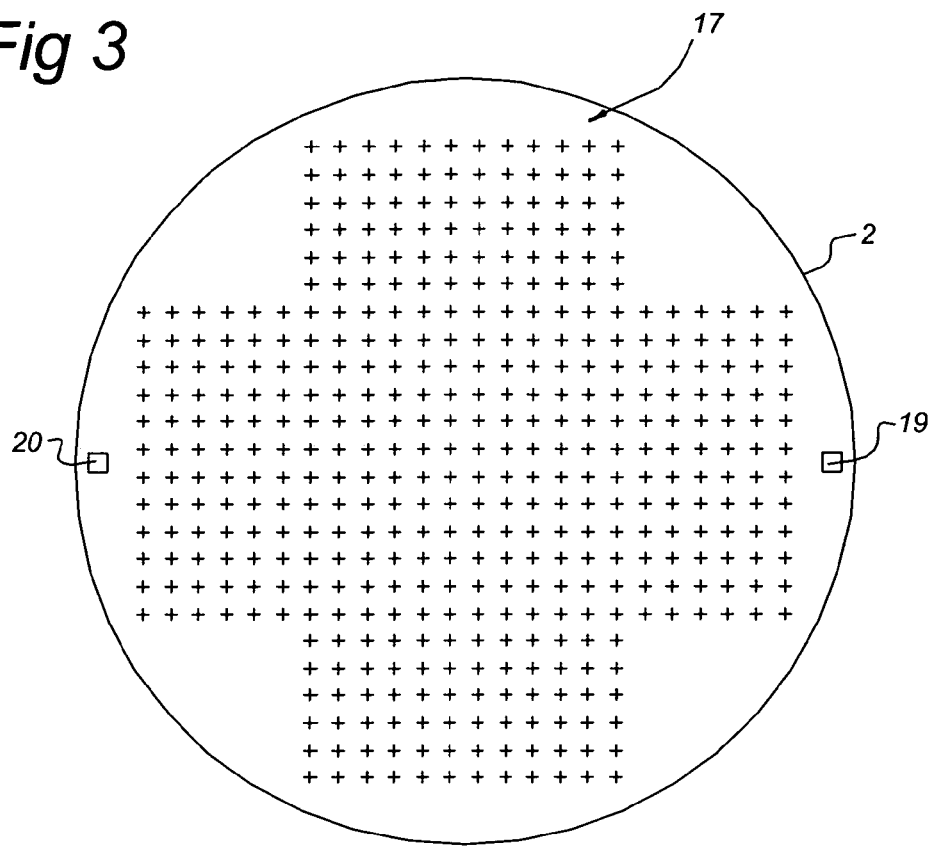
FIG. 3 is a top view of the top substrate before bonding.

The principle of the measuring method according to the invention will be explained with reference to FIGS. 2-10. FIG. 2 depicts a cross section of a first substrate 1, referred to as bottom substrate, and a second substrate 2, referred to as top substrate. In this example, the bottom substrate 1 includes a device layer 5, which may be a Si-layer including micro electronic devices, and a second layer 7, which may be a Low Temperature Oxide (LTO) layer including several vias 9. Both the bottom substrate 1 as well as the top substrate 2 may be SOI substrates. In this example, the top substrate 2 includes a first Si-layer 11, a $SiO_2$-layer 13 and a second Si-layer 15. According to an embodiment of the invention, a plurality of marks 17 are manufactured at the surface of the second Si-layer 15 before the top substrate 2 is bonded to the bottom substrate 1. The marks 17 may be manufactured using known lithographic techniques. Besides the marks 17, two global alignment marks 19, 20 are created at the surface of the second Si-layer 17. FIG. 3 is a top view of the top substrate 2 before bonding.

FIG. 3 depicts a possible arrangement of the marks 17. To obtain the arrangement of the marks 17 shown in FIG. 3, the top substrate 2 is exposed with a simple overlay pattern e.g. an 11×11 array of marks covering the illumination field of an exposure tool. This pattern is exposed to cover as much of the substrate surface as possible by reducing the step size so that each of the exposure fields butts together. The marks 17 can be manufactured on a regular grid (i.e. two-dimensional array), but other configurations are possible. The global alignment marks 19, 20 are positioned at the edge of the substrate 2, but other configurations are possible. The number of global alignment marks 19, 20 may vary.

Figure 4:
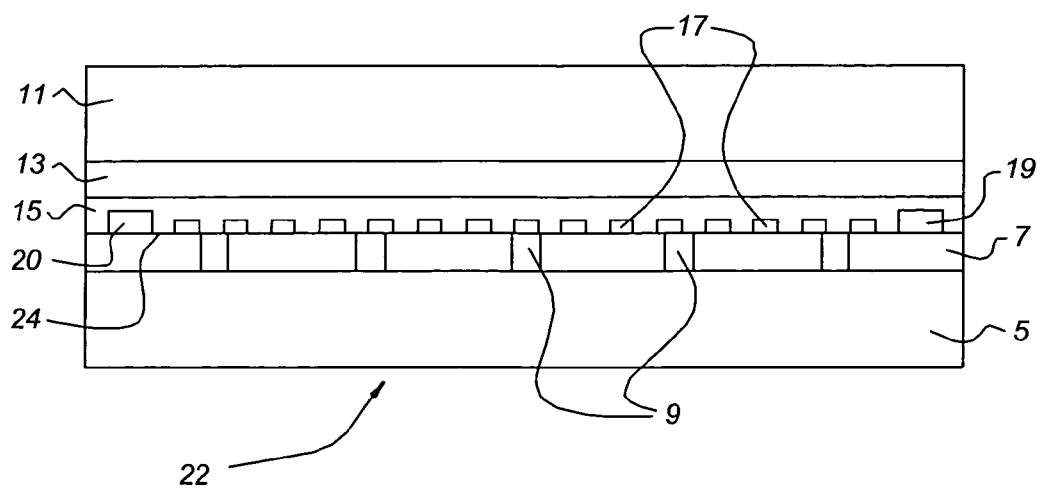
FIG. 4 is a cross section of a bonded substrate before etching/polishing.
Figure 5:
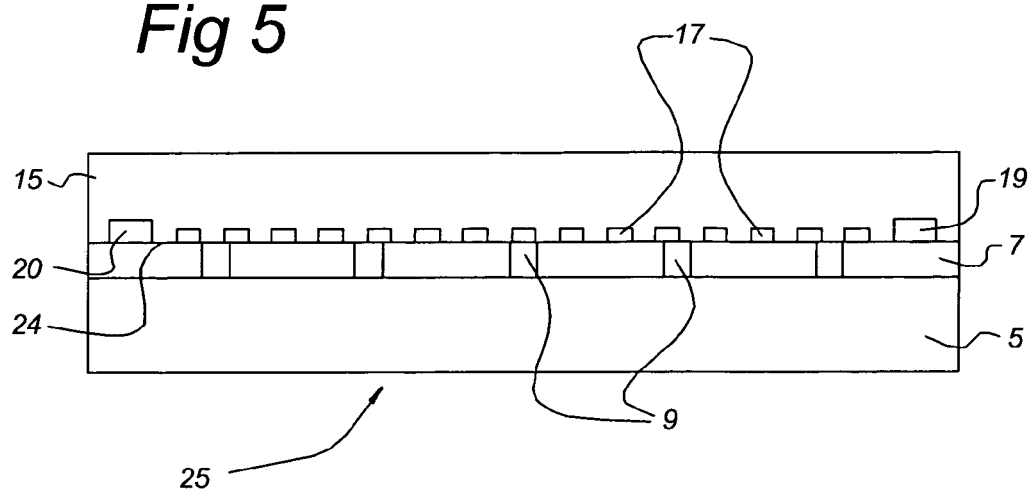
FIG. 5 is a cross section of the bonded substrate of FIG. 4 after etching.

In an embodiment of the present invention, a next action is to bond the bottom substrate 1 to the top substrate 2. This can be done using well known techniques such as low temperature anodic bonding. FIG. 4 shows a cross section of a bonded substrate 22. The top substrate 2 is placed on top of the bottom substrate 1 in such a way that the second Si-layer 15 is facing the second layer 7 of the bottom substrate 1 at an interface 24. Next, both the first Si-layer 11 and the $SiO_2$-layer 13 are removed using common etching and/or polishing techniques. FIG. 5 is a cross section of the bonded substrate 22 of FIG. 4 after the removal of the first Si-layer 11 and the $SiO_2$-layer 13. It is referred to as clean bonded substrate 25. The clean bonded substrate 25 is aligned using the global alignment marks 19, 20. The global alignment marks are arranged at the interface 24 but since the second Si-layer 15 is very thin, for example 4 μm, the global alignment marks 19, 20 can be detected from above through second Si-layer 15. This means no clear-out windows are required for aligning the clean bonded substrate 25.

Figure 6:
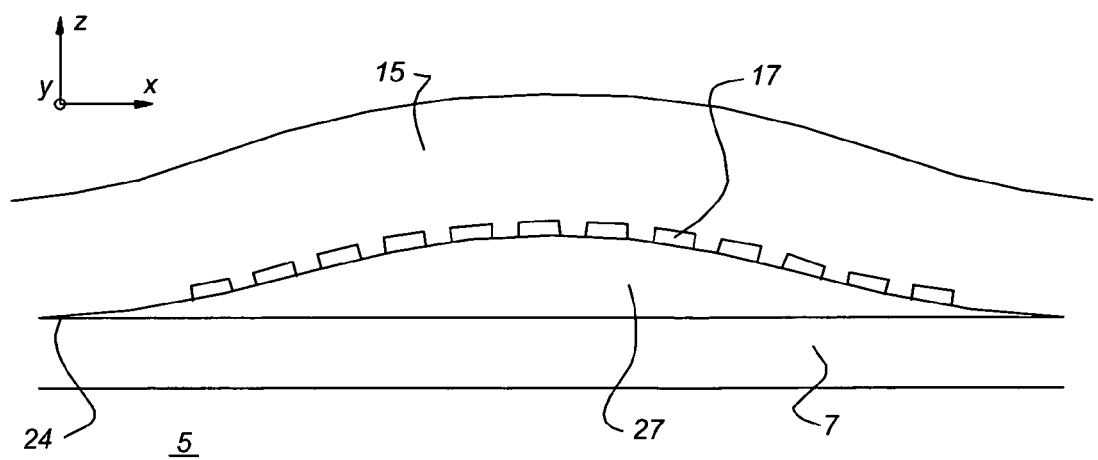
FIG. 6 is a detailed cross section of the interface of the bonded substrate of FIG. 5.

FIG. 6 is a detailed cross section of part of the clean bonded substrate 25 near the interface 24. At the interface 24 de-lamination may occur. Due to such de-lamination at the interface 24, a cavity 27 may arise. In FIG. 6, it is clear to see that some of the marks 17 are not in contact with the bottom substrate 1, i.e. with the second layer 7. It is noted that for reasons of clarity, the amount of de-lamination is exaggerated as compared to an actual de-lamination.

Figure 7:
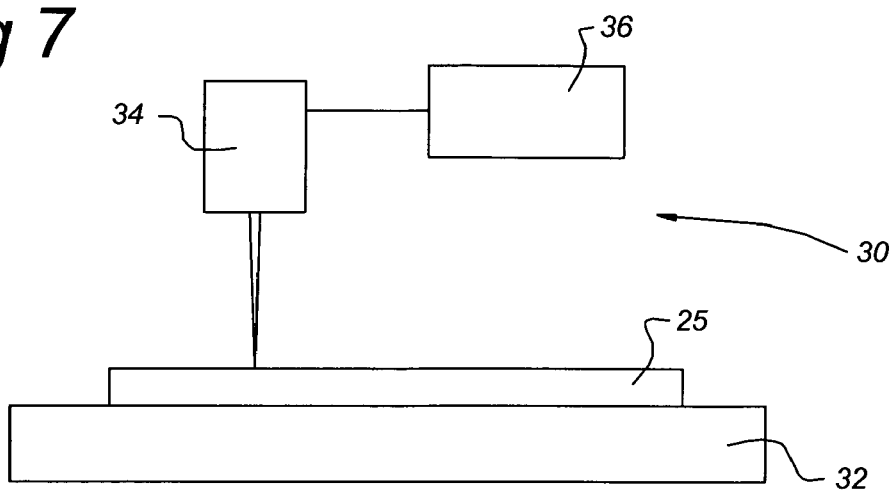
FIG. 7 schematically depicts a diagram of a metrology apparatus according to an embodiment of the present invention.

After the manufacture of the clean bonded substrate 25, the clean bonded substrate 25 is placed into a metrology apparatus for measurement purposes. FIG. 7 schematically depicts a diagram of a metrology apparatus 30 according to an embodiment of the present invention. The metrology apparatus 30 includes a table 32 on which the clean bonded substrate 25 is placed. The metrology apparatus 30 further includes a processor 36 and a measuring unit 34 configured to measure a position of the marks 17 on the clean bonded substrate 25. The table 32 can be moved with respect to the measuring unit 34. In an embodiment, the clean bonded substrate 25 includes global alignment marks 19, 20, which are used to align the clean bonded substrate 25 with respect to a 'nominal grid'. The nominal grid is defined as a two-dimensional coordinate system including an array (i.e. grid) of points. Once the clean bonded substrate 25 is aligned, the positions of the marks 17 are determined with respect to the nominal grid. The processing unit 36 is arranged to receive measurement data from the measuring unit 34 and is arranged to calculate for each of the marks 17, a difference between a measured position and an expected position. The expected position of a mark 17 is that position where the particular mark 17 would have been measured in the case of no de-lamination. Due to de-lamination at particular areas, marks at those areas are moved away from the interface 24. Thus, marks 17 present in such an area are moved in a direction substantially perpendicular to a plane of the interface 24, i.e. they all have moved in a Z-direction, the Z-direction being defined as that direction which is perpendicular to the plane of the interface 24. It is noted that the interface 24 may not be exactly parallel to the surface of the table 32. The present invention is partly based on the insight that the marks 17 which moved away from the interface are not only moved in the Z-direction, but most of them are also moved in a planar direction perpendicular to the Z-direction. In other words, the marks are moved in an X and/or Y direction. By measuring the position of the marks 17, and comparing the measured position to the expected positions, for each mark 17 a vector can be construed indicating a change in position. The construction of a vector field is done by the processing unit 36. The processing unit 36 is also arranged to determine de-lamination areas using the vector field. The de-lamination areas can be found by looking at the magnitude of the respective vectors. If in a particular area the vectors exceed a certain threshold, that area is most likely to be a de-lamination area.

Figure 8:
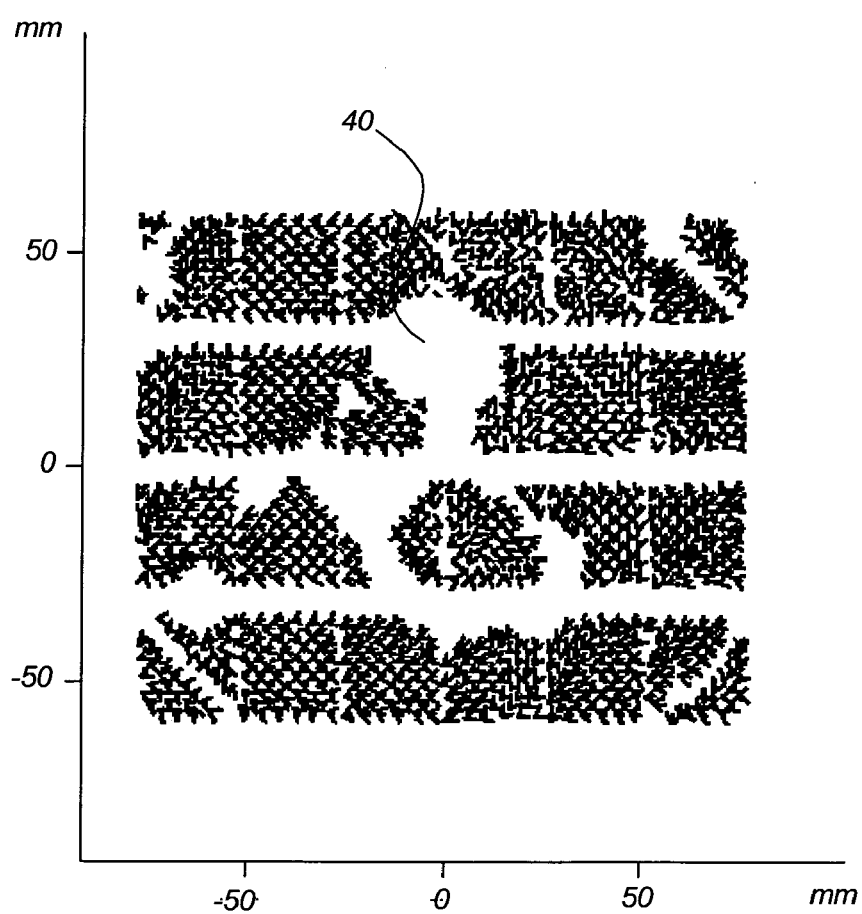
FIG. 8 depicts a vector field resulting from measurement of the marks present on the bonded substrate of FIG. 5.

FIG. 8 depicts an example of a vector field resulting from measurement of the marks 17 present on the clean bonded substrate 25. The marks 17 are arranged in a regular grid and grouped in exposure fields. The exposure fields are butt together as to cover as much of the area of the clean bonded substrate 25. The small vectors shown in FIG. 8 indicate the small displacements of the marks 17. Note that even unmoved marks are depicted as vectors, but these vectors do not have tails. According to an embodiment, the processor 36 is arranged to determine de-lamination areas defined as areas in which the displacement vectors exceed a certain threshold value. By displaying the vector field on a display or on paper, the de-lamination areas can be shown to a user. By investigating the vector fields, the user can determine the bonding quality of the clean bonded substrate 25. Alternatively, the processor 36 is arranged to determine the bonding quality without interference of a user, i.e., by comparing the displacement vectors of the vector fields with a predetermined threshold and by calculating areas in which the vectors exceed the predefined threshold.

Figure 9:
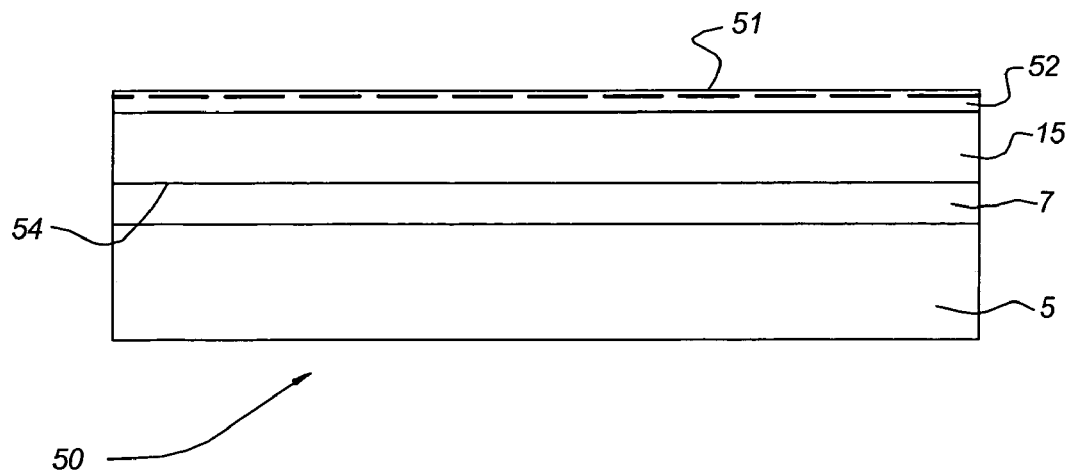
FIG. 9 is a cross section of a bonded substrate manufactured according to a method according to another embodiment of the invention.
Figure 10:
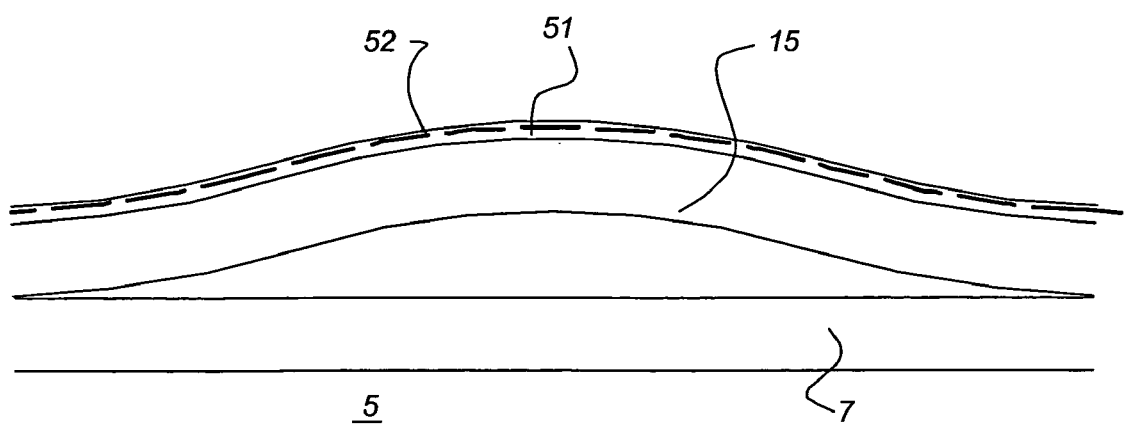
FIG. 10 is a detailed cross section of the interface of the bonded substrate of FIG. 9.

In another embodiment of the invention, the marks are created after the top substrate and the bottom substrate are bonded. FIG. 9 depicts a cross section of another bonded substrate 50 having an interface 54. On top of the bonded substrate 50, top marks 51 are created using a lithographic apparatus as shown in FIG. 1. In an embodiment, the top marks 51 are created in a resist layer 52 which is put on top of the bonded substrate 51 after the bonded substrate 50 is cleaned. FIG. 10 depicts a detailed cross section of the interface 54 of the bonded substrate of FIG. 9. In order to develop the resist layer 52, the bonded substrate 51 must be placed in an oven. During the baking process, the de-lamination at the interface, already present after bonding, will continue. This results in a displacement of the top marks 51. As was explained above, the displacement of the top marks 51 will result in planar movements of the top marks 51. These planar movements can be measured by the metrology apparatus 30 shown in FIG. 7. Since in this embodiment, there are no marks at the interface 54, which will most certainly harm the quality of a MEMS, this embodiment of the bonding quality measuring method is not only suitable for pure evaluation tests, but also during the real production of substrates.

In a further embodiment of the present invention, a method of producing a device, such as a MEMS, is provided wherein the device is produced from a bonded substrate. The bonding quality of the bonded substrate is first determined using the method as described above. Then, it is checked whether the bonded substrate meets a predetermined quality criteria. If not, the bonded substrate is rejected. If the criteria is met, the bonded substrate is transported to a lithographic apparatus, such as the apparatus shown in FIG. 1. The bonded substrate is then exposed in the lithographic apparatus in order to manufacture the device.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it should be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions that are executable to instruct an apparatus to perform a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the present invention as described without departing from the scope of the claims set out below.

What is claimed is:

1. A method of measuring bonding quality of a bonded substrate having a top substrate on top of a bottom substrate, the method comprising:
    creating a plurality of marks at a first side of the top substrate;
    bonding the top substrate onto the bottom substrate to form the bonded substrate;
    measuring positions of the plurality of marks;
    calculating for each of the plurality of marks, a difference between a measured position and an expected position; and
    determining delamination areas at an interface between the top substrate and the bottom substrate using the calculated difference.

2. A method according to claim 1, wherein the first side of the top substrate is facing the bottom substrate after bonding and wherein the plurality of marks are created before the top substrate and the bottom substrate are bonded.

3. A method according to claim 1, wherein the first side of the top substrate is a top surface of the top substrate that is not facing the bottom substrate after bonding, and wherein the plurality of marks are created after the top substrate and the bottom substrate are bonded.

4. A method according to claim 3, further comprising:
providing a resist layer on top of the bonded substrate; and
creating the plurality of marks in the resist layer.

5. A method according to claim 1, wherein at least one global alignment mark is arranged at the interface between the top substrate and the bottom substrate, the at least global alignment mark being used to align the bonded substrate to a nominal grid.

6. A method according to claim 1, further comprising constructing a vector field, the vector field comprising vectors corresponding to the calculated differences between the measured positions and the expected positions of each of the marks.

7. A method according to claim 6, wherein determining delamination areas comprises determining which vectors have a magnitude exceeding a threshold value.

8. A method of producing a device from a bonded substrate having a top substrate on top of a bottom substrate, the method comprising:
creating a plurality of marks at a first side of the top substrate;
bonding the top substrate onto the bottom substrate to form the bonded substrate;
measuring positions of the plurality of marks;
calculating for each of the plurality of marks, a difference between a measured position and an expected position;
determining delamination areas at an interface between the top substrate and the bottom substrate using the calculated difference;
determining whether the bonded substrate meets a predetermined quality criteria, and if not, rejecting the bonded substrate, and if so,
projecting a patterned beam of radiation onto a target portion of the bonded substrate.

9. A method according to claim 8, wherein the first side of the top substrate is facing the bottom substrate after bonding and wherein the plurality of marks are created before the top substrate and the bottom substrate are bonded.

10. A method according to claim 8, wherein the first side of the top substrate is a top surface of the top substrate that is not facing the bottom substrate after bonding and wherein the plurality of marks are created after the top substrate and the bottom substrate are bonded.

11. A method according to claim 10, further comprising:
providing a resist layer on top of the bonded substrate; and
creating the plurality of marks in the resist layer.

12. A method according to claim 8, wherein at least one global alignment mark is arranged at the interface between the top substrate and the bottom substrate, the at least global alignment mark being used to align the bonded substrate to a nominal grid.

13. A method according to claim 8, further comprising constructing a vector field, the vector field comprising vectors corresponding to the calculated differences between the measured positions and the expected positions of each of the marks.

14. A method according to claim 13, wherein determining delamination areas comprises determining which vectors have a magnitude exceeding a threshold value.

* * * * *